(12) United States Patent
Fujikura (10) Patent No.: US 9,856,562 B2
(45) Date of Patent: Jan. 2, 2018

(54) SEMICONDUCTOR MANUFACTURING DEVICE AND SEMICONDUCTOR MANUFACTURING METHOD

(71) Applicant: SUMITOMO CHEMICAL COMPANY, LIMITED, Tokyo (JP)

(72) Inventor: Hajime Fujikura, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/508,683

(22) PCT Filed: Jul. 8, 2015

(86) PCT No.: PCT/JP2015/069586
§ 371 (c)(1),
(2) Date: Mar. 3, 2017

(87) PCT Pub. No.: WO2016/035449
PCT Pub. Date: Mar. 10, 2016

(65) Prior Publication Data
US 2017/0260628 A1 Sep. 14, 2017

(30) Foreign Application Priority Data
Sep. 5, 2014 (JP) .................................. 2014-180854

(51) Int. Cl.
*H01L 21/20* (2006.01)
*C23C 16/455* (2006.01)
(Continued)

(52) U.S. Cl.
CPC .......... *C23C 16/455* (2013.01); *C23C 16/448* (2013.01); *C23C 16/46* (2013.01);
(Continued)

(58) Field of Classification Search
CPC . H01L 29/2003; C23C 16/455; C23C 16/448; C23C 16/46; C30B 25/02;
(Continued)

(56) References Cited

U.S. PATENT DOCUMENTS

2002/0063258 A1* 5/2002 Motoki .................... H01L 33/16
257/95
2007/0151509 A1 7/2007 Park et al.
(Continued)

FOREIGN PATENT DOCUMENTS

JP 2006-120857 A 5/2006
JP 2009-520678 A 5/2009
(Continued)

OTHER PUBLICATIONS

English Translation of International Preliminary Report on Patentability and Written Opinion of the International Searching Authority (Forms PCT/IB/338, PCT/IB/373 and PCT/ISA/237) dated Mar. 16, 2017, for International Application No. PCT/JP2015/069586.
(Continued)

*Primary Examiner* — Brook Kebede
(74) *Attorney, Agent, or Firm* — Birch, Stewart, Kolasch & Birch, LLP (57) ABSTRACT

There is provided a semiconductor manufacturing device that supplies a source gas to a substrate installed in a reaction furnace and performs film formation processing to the substrate, including: a storage vessel which is disposed in the reaction furnace and which stores a metal raw material as a base of the source gas; an auxiliary vessel which is disposed at an upper side of the storage vessel in the reaction furnace and which is a bottomed vessel having an inlet port for the metal raw material; a connection pipe through which an outlet port for the metal raw material formed on the auxiliary vessel and an inside of the storage vessel are
(Continued)

communicated with each other; a sealing plug for sealing the outlet port so as to be opened and closed freely; and heater units that heat an inside of the reaction furnace to a predetermined temperature so as to melt the metal raw material in the auxiliary vessel and the metal raw material in the storage vessel, and to a predetermined temperature required for film formation processing performed to the substrate.

9 Claims, 7 Drawing Sheets (51) Int. Cl.
*C23C 16/448* (2006.01)
*C23C 16/46* (2006.01)
*C30B 25/08* (2006.01)
*C30B 25/10* (2006.01)
*C30B 25/14* (2006.01)
*C30B 29/40* (2006.01)
*C30B 25/18* (2006.01)

(52) U.S. Cl.
CPC .............. *C30B 25/08* (2013.01); *C30B 25/10* (2013.01); *C30B 25/14* (2013.01); *C30B 25/18* (2013.01); *C30B 29/406* (2013.01)

(58) Field of Classification Search
CPC ......... C30B 25/08; C30B 25/10; C30B 25/14; C30B 25/16; C30B 25/18; C30B 25/165; C30B 29/406
USPC ........................................................ 438/478
See application file for complete search history.

(56) References Cited

U.S. PATENT DOCUMENTS

2013/0069075 A1* 3/2013 Fujikura ................. C30B 25/16
257/76
2013/0247817 A1 9/2013 Konno et al.

FOREIGN PATENT DOCUMENTS

| JP | 2010-168228 A | 8/2010 |
| JP | 2013-225648 A | 8/2010 |

OTHER PUBLICATIONS

International Search Report, issued in PCT/JP2015/069586, PCT/ISA/210, dated Oct. 13, 2015.

* cited by examiner

SEMICONDUCTOR MANUFACTURING DEVICE AND SEMICONDUCTOR MANUFACTURING METHOD

TECHNICAL FIELD

The present invention relates to a semiconductor manufacturing device and a semiconductor manufacturing method used for a crystal growth of a nitride semiconductor for example.

DESCRIPTION OF THE RELATED ART

Nitride semiconductors such as gallium nitride (GaN), aluminum gallium nitride (AlGaN), and indium gallium nitride (InGaN), etc., are attracting attention as light emitting device materials capable of emitting red to ultraviolet lights. As a method of a crystal growth of these nitride semiconductors, a hydride vapor phase epitaxy (HVPE) method can be mentioned. HVPE method is a method of growing a crystal from a gaseous metal chloride gas at a high temperature, and specifically, this is a method including: supplying a group III source gas which is a metal chloride gas containing a chloride of a group III element and a group V source gas containing a hydride of a group V element, to a substrate in a reaction tube, to thereby grow a group III-V semiconductor crystal on the substrate. For example, in a case of gallium (Ga)-based compound semiconductors such as gallium nitride (GaN), gallium arsenide (GaAs), and gallium phosphide (GaP), etc., gallium chloride (GaCl) gas or gallium trichloride ($GaCl_3$) gas generated by bringing hydrogen chloride (HCl) gas or chlorine ($Cl_2$) gas into contact with Ga of a high temperature (about 300 to 800° C.) is used as the group III source gas, and an ammonia ($NH_3$) gas, an arsine ($AsH_3$) gas or a phosphine ($PH_3$) gas is used as the group V source gas, to thereby make it possible to efficiently grow the crystal.

Figure 7:
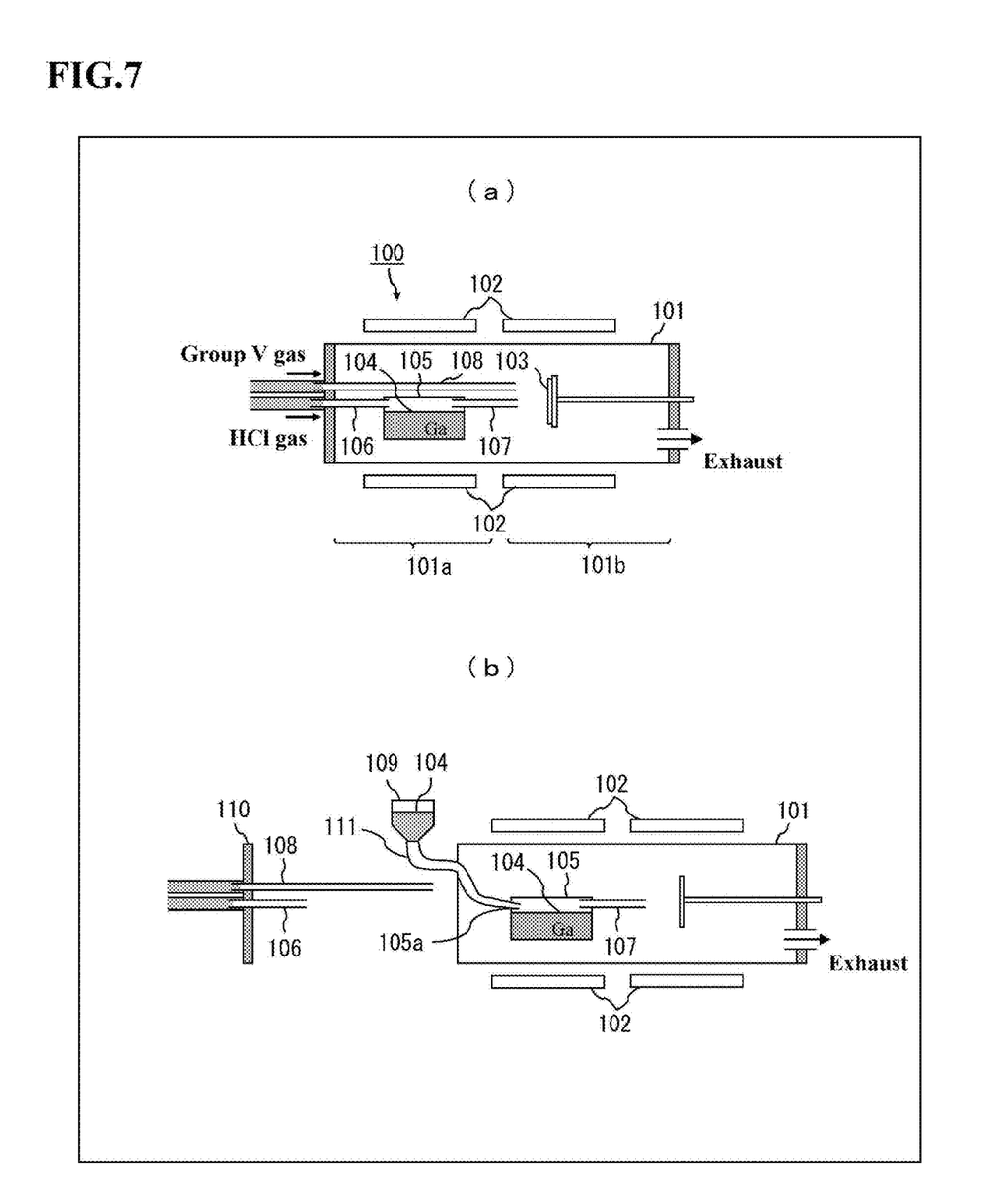
FIG. 7 is an explanatory view showing a configuration example of an essential part of a conventional HYPE device.

As a semiconductor manufacturing device (hereinafter also referred to as "HVPE device") that performs crystal growth by HYPE method, for example, a device having a configuration as shown in FIG. 7 is known (see, for example, patent document 1). That is, as shown in FIG. 7(a), HVPE device 100 is configured to include a cylindrical reaction furnace 101, and a raw material section 101a and a growth section 101b in the reaction furnace 101. The raw material section 101a and the growth section 101b in the reaction furnace 101 are heated by heater units 102 respectively. A substrate 103 to be processed is installed in the growth section 101b in the reaction furnace 101. On the other hand, a storage vessel 105 that stores a metal raw material (for example, Ga) 104 is disposed in the raw material section 101a in the reaction furnace 101. A pipe 106 and a pipe 107 are connected to the storage vessel 105, wherein the pipe 106 is provided for supplying a chlorine-based gas into the storage vessel 105, and the pipe 107 is provided for discharging a metal chloride gas which is generated by a reaction of a metal raw material 104 and a chlorine-based gas, from the storage vessel 105, and guiding the discharged metal chloride gas to the growth section 101b as the group III source gas. Further, a pipe 108 for guiding the group V source gas to the growth section 101b is also provided in the reaction furnace 101, separately from pipes 106 and 107. Then, the group III source gas and the group V source gas are merged in the growth section 101b, to thereby grow a group III-V semiconductor crystal on the substrate 103 installed in the growth section 101b. If these source gases are mixed before reaching the growth section 101b, a semiconductor crystal is deposited at a mixture position, and there is a possibility that HVPE device 100 may be damaged thereby. Therefore, the storage vessel 105 has a configuration that does not cause leakage of the metal chloride gas generated in the vessel.

PRIOR ART DOCUMENT

Patent Document

Patent document 1: Japanese Patent Laid Open Publication No. 2013-225648

SUMMARY OF THE INVENTION

Problem to be Solved by the Invention

In HVPE device 100 having the abovementioned configuration, when a crystal growth processing is repeatedly performed to the substrate, the metal raw material 104 stored in the storage vessel 105 is decreased, and therefore there is a necessity to perform replenishment of the metal raw material 104 into the storage vessel 105.

The metal raw material 104 stored in the storage vessel 105 exists in a state having fluidity as long as a temperature is set to a temperature exceeding a melting point of the metal raw material 104, for example like a temperature of an inside of a reaction furnace during heating. However, under a normal temperature (room temperature) environment, the metal raw material 104 exists as a solidified matter, for example such as a granular or rectangular parallelepiped ingot. It is not realistic to directly charge such a solidified matter into the storage vessel 105 and perform replenishment of the metal raw material 104 into the storage vessel 105. This is because the storage vessel 105 is required to be configured so as not to cause the gas leakage as described above, and it is extremely difficult to provide the storage vessel 105 with an opening having a size capable of charging granular or rectangular parallelepiped ingots or the like.

Therefore, the replenishment of the metal raw material 104 into the storage vessel 105 is generally performed by the following procedure. First, a heating device such as an electric furnace (not shown) is prepared separately from HYPE device 100, and using this heating device, the solidified matter of the metal raw material 104 is heated to a temperature higher than the melting point and liquefied. After the solidified matter is liquefied, as shown in FIG. 7(b), a dedicated instrument 109 such as a syringe, etc., is filled with the liquefied metal raw material 104, and by detaching a flange 110 on the side where the pipes 106, 108 are disposed, one end side of the reaction furnace 101 is set in an opened state. Thereafter, from the opened end side of the reaction furnace 101, the dedicated instrument 109 is connected to the storage vessel 105 through a dedicated connection pipe 111 such as a heat-resistant tube, etc. At this time, the tip of the dedicated connection pipe 111 is connected to an opening portion 105a of the storage vessel 105 that appears after detaching the pipe 106. After the dedicated instrument 109 is connected to the storage vessel 105, in this state, the metal raw material 104 filled in the dedicated instrument 109 is injected into the storage vessel 105. In this manner, the inside of the storage vessel 105 is replenished with the metal raw material 104.

However, in the abovementioned replenishment procedure, a disassembling operation for detaching the pipe 106 connected to the storage vessel 105, from the storage vessel 105 must be performed when replenishment of the metal raw material 104 into the storage vessel 105 is performed. After the replenishment of the metal raw material 104 into the storage vessel 105 is performed, a reassembling operation of connecting the detached pipe 106 to the storage vessel 105 is required, and a purification treatment (for example, a high-temperature heat treatment for a long time) for removing impurities, etc., from the metal raw material 104 and a processing for confirming the subsequent growth reproducibility, are required. Further, in order to perform replenishment of the metal raw material 104 into the storage vessel 105, a heating device such as an electric furnace, etc., is required to prepare. That is, in the abovementioned replenishment procedure, there is a problem that much labor and time are required to perform replenishment of the metal raw material 104 into the storage vessel 105, and further another device such as a heating device, etc., must be prepared.

Therefore, an object of the present invention is to provide a semiconductor manufacturing device and a semiconductor manufacturing method capable of easily performing replenishment of the metal raw material into the storage vessel disposed in the reaction furnace.

Means for Solving the Problem

In order to achieve the abovementioned object, the present invention is constituted as follows.

According to an aspect of the present invention, there is provided a semiconductor manufacturing device that supplies a source gas to a substrate installed in a reaction furnace and performs film formation processing to the substrate, including:

a storage vessel which is disposed in the reaction furnace and which stores a metal raw material as a base of the source gas;

an auxiliary vessel which is disposed at an upper side of the storage vessel in the reaction furnace and which is a bottomed vessel having an inlet port for the metal raw material;

a connection pipe through which an outlet port for the metal raw material formed on the auxiliary vessel and an inside of the storage vessel are communicated with each other;

a sealing plug for sealing the outlet port so as to be opened and closed freely; and heater units that heat an inside of the reaction furnace to a predetermined temperature so as to melt the metal raw material in the auxiliary vessel and the metal raw material in the storage vessel, and to a predetermined temperature required for film formation processing performed to the substrate.

According to another aspect of the present invention, there is provided a semiconductor manufacturing method, including:

installing a substrate at a predetermined position in a reaction furnace including a storage vessel that stores a metal raw material; and charging the metal raw material from an inlet port into an auxiliary vessel disposed at an upper side of the storage vessel in the reaction furnace and formed as a bottomed vessel having an outlet port for the metal raw material communicating with an inside of the storage vessel through a connection pipe, and the inlet port for the metal raw material, in a state where a an outlet port for the metal raw material is sealed by a sealing plug for sealing the outlet port so as to be opened and closed freely;

heating the inside of the reaction furnace to a predetermined temperature so as to melt the metal raw material in the auxiliary vessel and the metal raw material in the storage vessel, and to a predetermined temperature required for film formation processing performed to the substrate;

supplying a gas into the storage vessel and causing a reaction between the gas and the metal raw material to generate a source gas, and discharging the source gas from the storage vessel and supplying the source gas to the substrate, so that film formation processing is performed;

unloading the substrate after performing the film formation processing, from the inside of the reaction furnace; and setting the sealing plug for sealing the outlet port in an opened state and performing replenishment of the metal raw material in the auxiliary vessel into the storage vessel through the outlet port and the connection pipe.

Advantage of the Invention

According to the present invention, the replenishment of a metal raw material into a storage vessel disposed in a reaction furnace can be easily performed.

DETAILED DESCRIPTION OF THE INVENTION

A semiconductor manufacturing device and a semiconductor manufacturing method of the present invention will be described hereafter, based on the drawings.

(1) Configuration of the Semiconductor Manufacturing Device

A configuration of the semiconductor manufacturing device of the present invention will be described first, with reference to a specific example. Here, as an example of the semiconductor manufacturing device, HVPE device that forms a thin film on a substrate to be processed by utilizing a crystal growth by HYPE method will be described.

Figure 1:
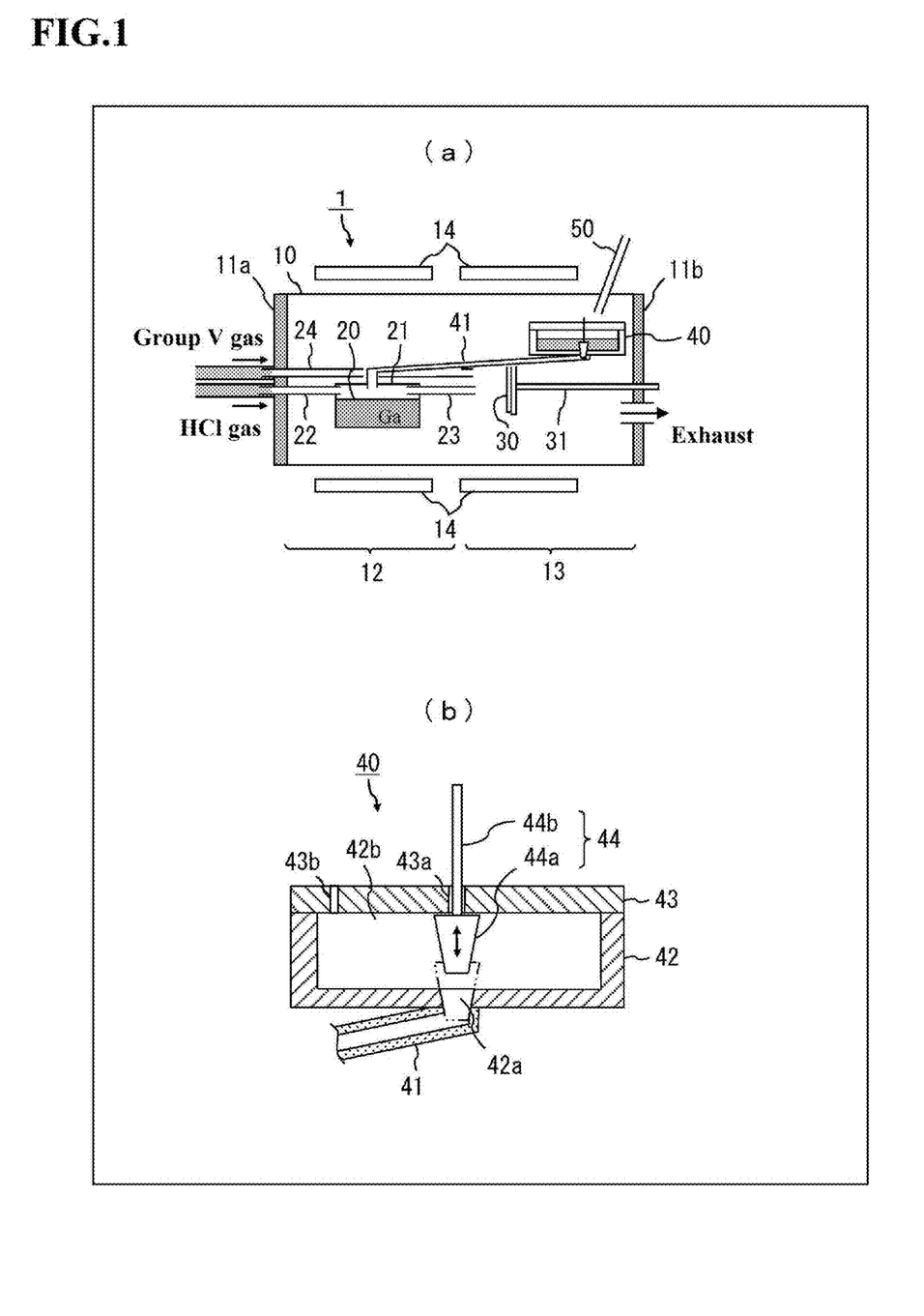
FIG. 1 is an explanatory view showing a configuration example of an essential part of HVPE device according to the present invention.

FIG. 1 is an explanatory view showing a configuration example of an essential part of HVPE device according to the present invention, wherein (a) is a view schematically showing an outline configuration of an inside of a reaction furnace, and (b) is a view schematically showing an outline configuration of an auxiliary vessel which is a characteristic configuration.

(Reaction Furnace)

As shown in FIG. 1(a), HVPE device 1 includes a reaction furnace 10 formed, for example, in a cylindrical shape using a heat-resistant material such as quartz glass, etc. Both edges of the reaction furnace 10 are closed by flange parts 11a and 11b made of a metal material such as a stainless steel material, etc. The flange parts 11a and 11b are attached to the reaction furnace 10 detachably as required. Since the flange parts 11a and 11b can be attached and detached, opening portions at the edges of the reaction furnace 10 can be opened and closed freely. One of the opening portions functions as a loading and unloading port for the substrate 30 as described later.

Further, the reaction furnace 10 has a raw material section 12 and a growth section 13 in its inside. More specifically, the inside of the reaction furnace 10 is divided into the raw material section 12 positioned on an upstream side of a gas flow described later and the growth section 13 positioned on a downstream side of the gas flow direction.

Heater units 14 for heating the inside of the reaction furnace 10 are provided on an outer peripheral side of the reaction furnace 10. The heater units 14 are configured so that the raw material section 12 and the growth section 13 in the reaction furnace 10 can be heated separately. Thereby, for example, the heater units 14 can heat the raw material section 12 to about 850° C. and heat the growth section 13 to about 1000° C.

(Growth Section)

A tray part 31 for supporting the substrate 30 to be processed is disposed in the growth section 13 in the reaction furnace 10. The tray part 31 supports the substrate 30 so that it can be rotated at a predetermined speed around a rotation axis extending along a cylindrical axis direction of the reaction furnace 10. Since the inside of the reaction furnace 10 is heated by the heater units 14, the tray part 31 is made of a heat-resistant material such as quartz, carbon, or the like.

As the substrate 30 supported by the tray part 31, for example, a flat sapphire substrate is used. A thin film different from the thin film to be formed may already be formed on the surface of the substrate 30. A semiconductor device such as a semiconductor light emitting element, etc., is configured by performing film formation processing as described later to such a substrate 30.

Further, the tray part 31 is configured so that its rotation axis passes through the flange part 11b positioned at the growth section 13 side. As a result thereof, the substrate 30 supported by the tray part 31 can be installed in the reaction furnace 10 or taken out from the reaction furnace 10 accompanied by attachment and detachment of the flange part 11b to/from the reaction furnace 10. That is, the opening portion on the edge of the reaction furnace 10 with the flange part 11b detached, functions as the loading and unloading port for the substrate 30. When the flange part 11b is detached from the reaction furnace 10, the substrate 30 can be detached from the tray part 31 that passes through the flange part 11b, or the substrate 30 can be supported by the tray part 31.

(Raw Material Section)

A storage vessel 21 for storing the metal raw material 20 is disposed in the raw material section 12 in the reaction furnace 10. The storage vessel 21 is configured as a sealed vessel in which gas leakage or the like does not occur except for the pipes 22, 23 and the connection pipe 41, which will be described later, and is configured to store the metal raw material 20 in this sealed vessel. Since the storage vessel 21 is disposed in the reaction furnace 10, it is made of a heat-resistant material and made of a material having a light transmittance (visibility) for a confirmation, etc., of the remaining amount of the stored metal raw material 20. As such a material, it is conceivable to use quartz glass, for example.

The metal raw material 20 stored in the storage vessel 21 is a base of the group III source gas. Specifically, for example, gallium (Ga) which is one of the group III elements is used as the metal raw material 20. Since Ga has a relatively low melting point of 29.8° C., it exists in the storage vessel 21 in a molten state (that is, in a liquid state).

One end of the pipe 22 extending through the flange part 11a is connected to the storage vessel 21. The other end of the pipe 22 is connected to a supply source of a chlorine-based gas not shown. This pipe 22 is provided for supplying the chlorine-based gas into the storage vessel 21.

As the chlorine-based gas supplied from the pipe 22, for example hydrogen chloride (HCl) gas is used. For example, in a case that Ga is stored in the storage vessel 21 as the metal raw material 20, when HCl gas is supplied from the pipe 22 as the chlorine-based gas, Ga and HCl gas react with each other in the storage vessel 21 to generate gallium chloride (GaCl) gas which is a metal chloride gas. As will be described later, this GaCl gas is used for the film formation processing performed to the substrate 30, as the group III source gas.

Further, a pipe 23 extending toward the growth section 13 is connected to the storage vessel 21. The pipe 23 is provided for discharging the metal chloride gas generated in the storage vessel 21 from the inside of the storage vessel 21 and guiding it to the growth section 13 as the group III source gas.

A pipe 24 for guiding the group V source gas to the growth section 13 is also provided in the raw material section 12 in the reaction furnace 10, separately from these pipes 22 and 23. The pipe 24 is configured to extend through the flange part 11a without passing through the storage vessel 21. One end of the pipe 24 is disposed to face the substrate 30 installed in the growth section 13, similarly to one end of the pipe 23. The other end of the pipe 24 is connected to a supply source of a group V source gas not shown.

For example, ammonia ($NH_3$) gas is used as the group V source gas supplied from the pipe 24.

Since these pipes 22, 23, and 24 are disposed in the reaction furnace 10, they are all made of a heat-resistant material such as quartz glass, etc.

By providing these pipes 22, 23, and 24, a gas flow from the raw material section 12 toward the growth section 13 is formed in the reaction furnace 10. In order to ensure the formation of the gas flow in the reaction furnace 10, an exhaust port for exhausting the gas in the reaction furnace 10 is provided on the flange part 11b positioned on the downstream side of the gas flow.

(Auxiliary Vessel)

In the reaction furnace 10, an auxiliary vessel 40 is provided separately from the storage vessel 21. The auxiliary vessel 40 functions as a preliminary (sub) tank of the storage vessel 21 that stores the metal raw material 20. Therefore, the auxiliary vessel 40 is configured so that it can reserve the metal raw material 20. Then, in order to enable replenishment of the reserved metal raw material 20 into the reaction furnace 10 to be performed, the auxiliary vessel 40 is disposed at an upper side of the storage vessel 21, and a bottom portion thereof is connected to the storage vessel 21 through the connection pipe 41.

A configuration of the auxiliary vessel 40 will be described hereafter in detail.

As shown in FIG. 1(b), the auxiliary vessel 40 is configured including a reservoir vessel part 42 which is a bottomed vessel (a vessel having a bottom plate) having an opening at an upper side and a lid member 43 that closes the opening of the reservoir vessel part 42.

An outlet port 42a for the metal raw material 20 is formed at the bottom part of the reservoir vessel part 42. An upper end of a tubular connection pipe 41 is connected to the outlet port 42a. A lower end of the connection pipe 41 is connected to a ceiling part of the storage vessel 21. As a result thereof, the connecting pipe 41 is configured so that the outlet port 42a in the reservoir vessel part 42 communicates with the inside of the storage vessel 21.

A sealing plug 44 is detachably attached to the outlet port 42a. The sealing plug 44 has a tapered plug part 44a tapering downward and a stick-like rod part 44b extending upward from the plug part 44a. Then, when the plug part 44a is inserted into the outlet port 42a, the outlet port 42a is set in a closed state, and meanwhile when it is lifted upward by holding the rod part 44b, the outlet port 42a is set in an opened state. That is, the sealing plug 44 seals the outlet port 42a so that it can be opened and closed freely.

An opening formed at an upper side in the reservoir vessel part 42 functions as an inlet port 42b for allowing the metal raw material 20 to be charged into the reservoir vessel part 42. Here, the metal raw material 20 may be charged in a liquid state, but it is preferable to charge it as a solidified matter because labor for dissolution can be saved. The solidified matter of the metal raw material 20 refers to a matter of the metal raw material 20 that exists in a solid state without melting, specifically for example a material like a granular or rectangular parallelepiped material such as an ingot. In order to charge such a solidified matter, the inlet port 42b is formed as an opening larger than the solidified matter.

The lid member 43 that closes the inlet port 42b is detachably attached to the inlet port 42b. A guide hole 43a into which the rod part 44b is inserted is provided on the lid member 43 so as to guide a vertical movement of the sealing plug 44. Further, a through hole 43b through which gas is passed inside and outside of the auxiliary vessel 40, is provided on the lid member 43. The guide hole 43a and the through hole 43b may be separately provided, or one hole may be used in common.

The auxiliary vessel 40 having such a configuration is disposed in the vicinity of the opening portion on the edge of the reaction furnace 10, which functions as the loading and unloading port for the substrate 30. That is, the auxiliary vessel 40 is disposed in the growth section 13 in the reaction furnace 10. Therefore, the connection pipe 41 for communicating the inside of the storage vessel 21 and the inside of the auxiliary vessel 40 with each other, is formed so as to extend between the raw material section 12 and the growth section 13.

Since each of the auxiliary vessel 40, the connection pipe 41 and the sealing plug 44 is disposed in the storage vessel 21, each of them is made of a heat-resistant material such as quartz glass, etc., for example.

(Purge Processing Unit)

As shown in FIG. 1(a), a purge tube 50 is provided on the reaction furnace 10. One end of the purge tube 50 is positioned in the vicinity of the auxiliary vessel 40 in the reaction furnace 10. The other end of the purge tube 50 is connected to a supply source of an inert gas not shown. A purge processing unit for supplying the inert gas to the surroundings of the auxiliary vessel 40 in the reaction furnace 10 is configured by providing such a purge tube 50. It is conceivable to use, for example, nitrogen ($N_2$) gas as the inert gas supplied by the purge processing unit, but rare gases such as helium (He) gas, neon (Ne) gas, and argon (Ar) gas, etc., may be used other than the $N_2$ gas.

(2) Procedure of the Semiconductor Manufacturing Method

A procedure of the processing operation in HVPE device 1 having the abovementioned configuration, that is, a procedure of a specific example of the semiconductor manufacturing method according to the present invention will be described next. Here, explanation is given for the following case as an example. In order to constitute a semiconductor light emitting device which is a kind of the semiconductor device, GaCl gas which is the group III source gas and $NH_3$ gas which is the group V source gas are supplied to the sapphire substrate 30 installed in the reaction furnace 10, so that film formation processing is performed for forming a thin film of gallium nitride (GaN) on the sapphire substrate 30.

(Basic Procedure of the Film Formation Processing)

Here, a basic procedure of the film formation processing in HVPE device 1 will be described first.

Figure 2:
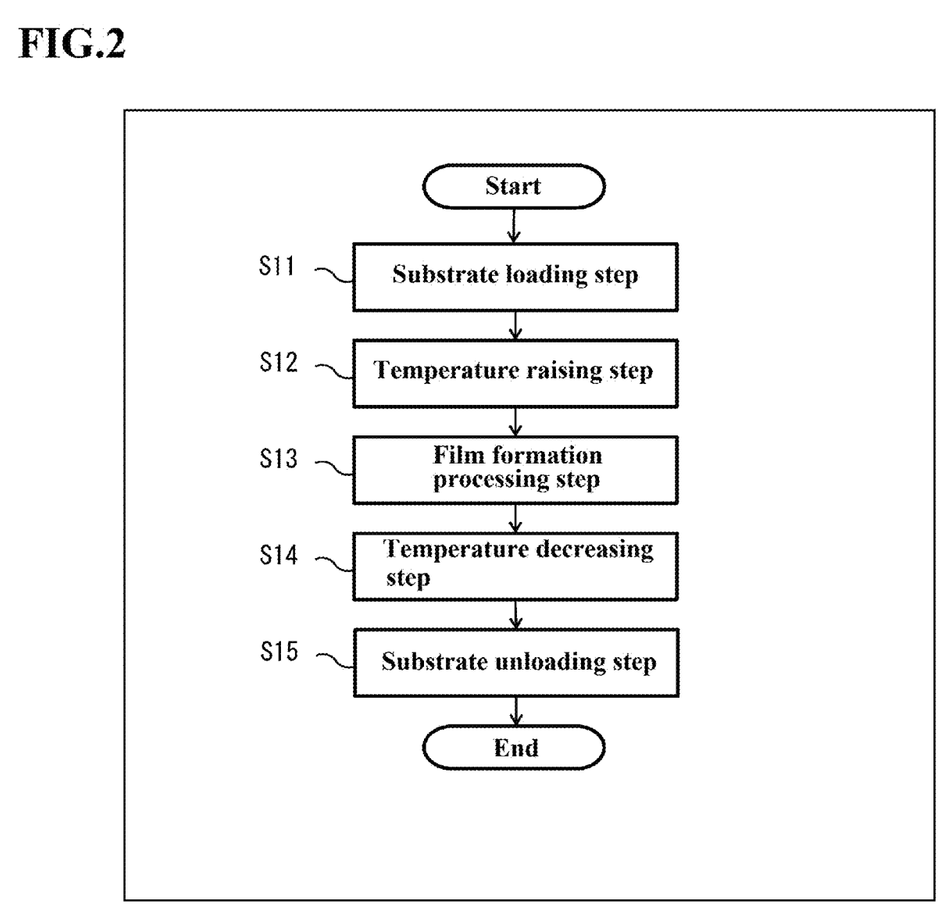
FIG. 2 is a flowchart showing an example of a basic procedure of film formation processing performed utilizing a crystal growth by HVPE method.

FIG. 2 is a flowchart showing an example of the basic procedure of the film formation processing performed utilizing a crystal growth by HVPE method.

When the film formation processing is performed using HVPE device 1, first, a substrate loading step (step 11, hereinafter, the step is abbreviated as "S") is performed. In the substrate loading step (S11), the substrate 30 to be processed is supported by the tray part 31, and the flange part 11b through which the tray part 31 passes, is attached to the reaction furnace 10, to thereby install the substrate 30 at a predetermined place in the reaction furnace 10. At this time, Ga which is the metal raw material 20, is already stored in the storage vessel 21 which is included in the reaction furnace 10.

After the substrate 30 is installed in the reaction furnace 10 in the substrate loading step (S11), a temperature raising step (S12) is performed after the atmosphere is expelled from the inside of the reaction furnace 10 by supply of the inert gas for example. In the temperature raising step (S12), the heater units 14 heat the inside of the reaction furnace 10 to a predetermined temperature. Specifically, for example, the heater units 14 heat the raw material section 12 to about 850° C. and heat the growth section 13 to about 1000° C. for example. The temperature of about 1000° C. in the growth section 13 is a temperature required for performing the film formation processing to the substrate 30. In addition, a heating temperature for the raw material section 12 and the growth section 13 is a temperature exceeding the melting point of Ga which is the metal raw material 20, and is a temperature at which the Ga becomes in a molten state.

After the inside of the reaction furnace 10 is heated to the predetermined temperature in the temperature raising step (S12), a film formation processing (S13) is performed next while maintaining the temperature of the inside of the reaction furnace 10 to the predetermined temperature. In the film formation processing step (S13), HCl gas as a chlorine-based gas is supplied into the storage vessel 21 through the pipe 22. When HCl gas is supplied, Ga and HCl gas react with each other to generate GaCl gas which is a metal chloride gas, in the storage vessel 21. Then, GaCl gas is guided from the inside of the storage vessel 21 to the growth section 13 through the pipe 23 and is supplied to the substrate 30 installed in the growth section 13 as the group III source gas. Further, in the film formation processing (S13), $NH_3$ gas as the group V source gas is supplied to the substrate 30 installed in the growth section 13, through the pipe 24. As a result thereof, in the growth section 13, GaCl gas as the group III source gas and $NH_3$ gas as the group V source gas are merged, to thereby grow a GaN crystal on the substrate 30. By continuously performing such a process for a predetermined time, a GaN layer having a predetermined film thickness is formed on the substrate 30.

In the film formation processing step (S13), when GaCl gas and $NH_3$ gas are supplied to the substrate 30 installed in the growth section 13, the inert gas such as $H_2$ gas or $N_2$ gas, etc., or a mixed gas thereof may be supplied as a carrier gas or a dilution gas through the pipes 22, 23 and 24, respectively. When GaCl gas and $NH_3$ gas are supplied to the substrate 30, it is preferable to supply the inert gas such as $N_2$ gas, etc., from the purge tube 50 to the surroundings of the auxiliary vessel 40.

After GaN layer having a predetermined film thickness is formed on the substrate 30 in the film formation processing step (S13), a temperature decreasing step (S14) is performed next. In the temperature decreasing step (S14), heating by the heater units 14 is stopped, and the temperature in the reaction furnace 10 is decreased naturally.

After the temperature inside of the reaction furnace 10 is decreased to, for example, a normal temperature in the temperature decreasing step (S14), subsequently, a substrate unloading step (S15) is performed. In the substrate unloading step (S15), the flange part 11b through which the tray part 31 passes, is detached from the reaction furnace 10, and the substrate 30 supported by the tray part 31 is taken out. As a result thereof, the substrate 30 already subjected to the film formation processing can be obtained, and a series of film formation processing starting from the substrate loading step (S11) can be performed for a new substrate 30.

By passing through the abovementioned steps (S11 to S15), for example GaN layer is formed on the substrate 30 and a semiconductor device is constituted. As the semiconductor device manufactured in this manner, for example there is a nitride semiconductor device in which AlN buffer layer is formed on a sapphire substrate and GaN layer is further laminated on the AlN buffer layer. However, the nitride semiconductor device described here is merely an example, and the film formation processing having the abovementioned procedure can also be used for a semiconductor device having another lamination structure.

(Procedure of Preparation Processing for the Auxiliary Vessel)

Incidentally, in HVPE device 1 described in this embodiment, preparation processing for the auxiliary vessel 40 has been performed beforehand at a start of the film formation processing including each of the steps (S11 to S15) described above. The "preparation processing" referred to here includes a processing for charging the solidified matter of the metal raw material 20 into the auxiliary vessel 40.

The processing for charging the solidified matter of the metal raw material 20 into the auxiliary vessel 40, will be described hereafter.

Figure 3:
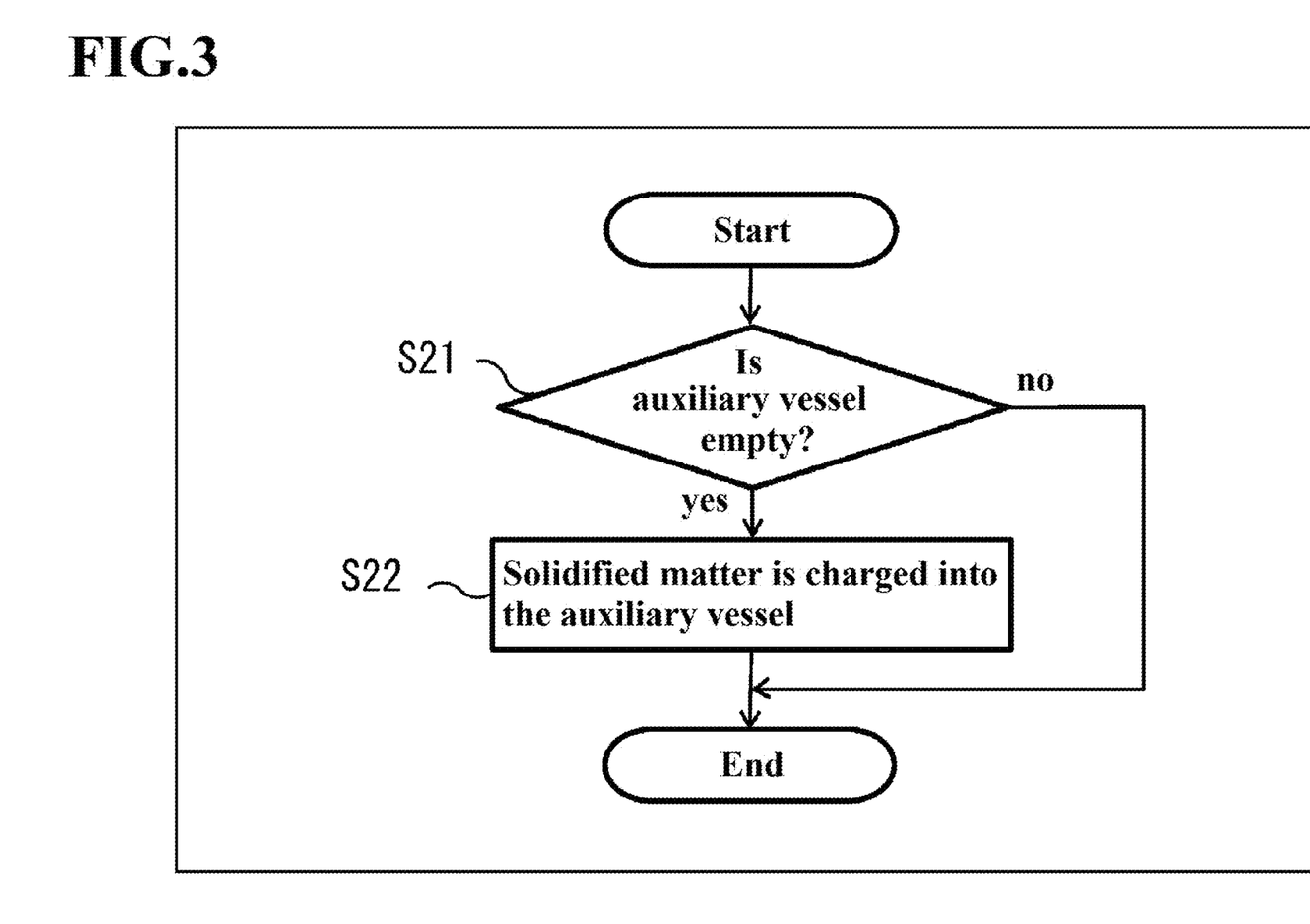
FIG. 3 is a flowchart showing an example of a procedure of preparation processing for an auxiliary vessel in HYPE device according to the present invention.
Figure 4:
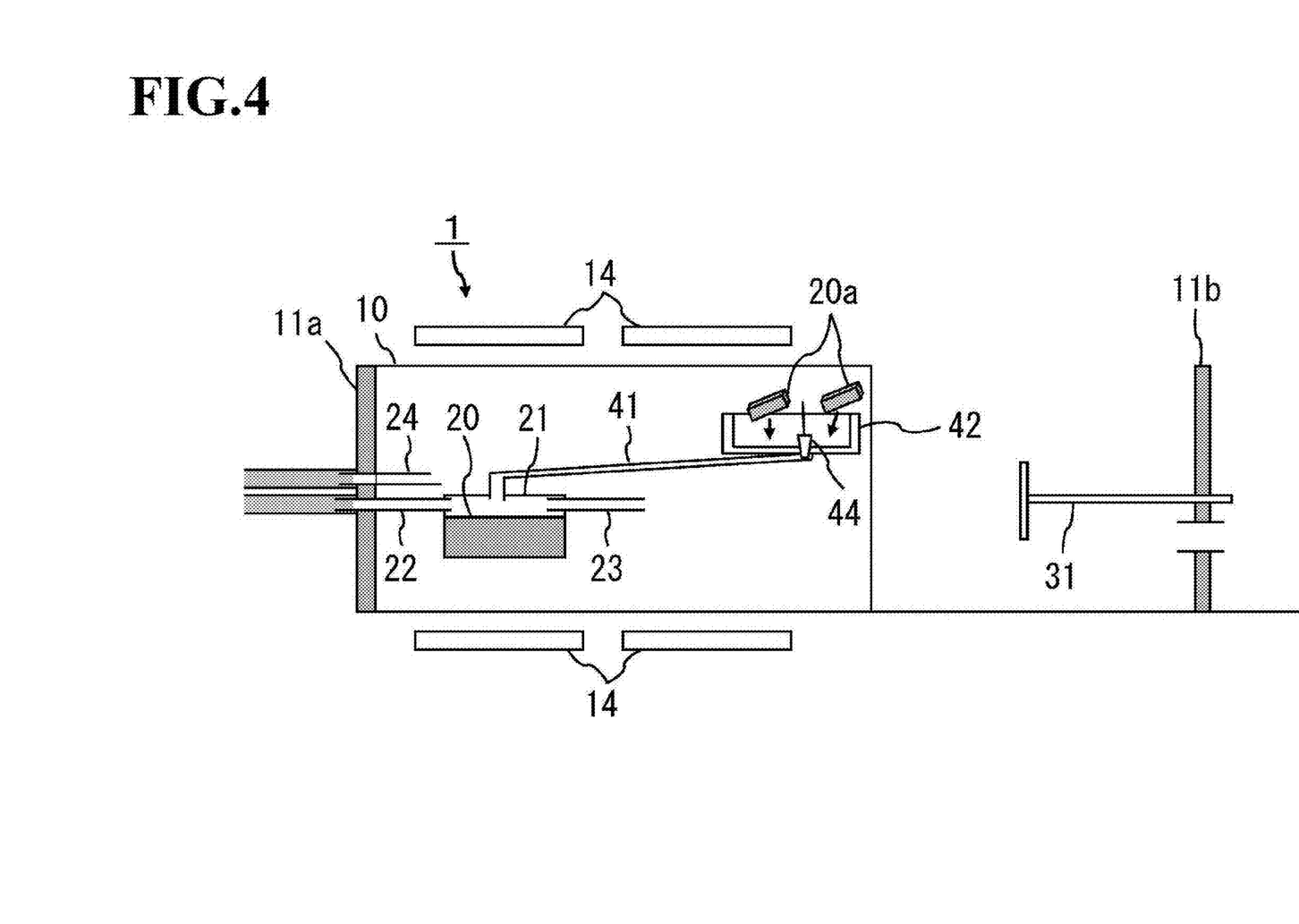
FIG. 4 is an explanatory view showing an example of a state of HYPE device when preparation processing shown in FIG. 3 is performed.

FIG. 3 is a flowchart showing an example of a procedure of the preparation processing for an auxiliary vessel in HVPE device according to the present invention. FIG. 4 is an explanatory view showing an example of a state of HVPE device when the preparation processing shown in FIG. 3 is performed.

In HYPE device 1, processing for charging the solidified matter of the metal raw material 20 into the auxiliary vessel 40 is performed as the preparation processing for the auxiliary vessel 40, before the abovementioned substrate loading step (S11) is completed at latest.

Specifically, first, as shown in FIG. 3, whether or not the auxiliary vessel 40 is empty is judged (S21). Such a judgment may be performed by confirming the auxiliary vessel 40 disposed in the vicinity of the edge opening of the reaction furnace 10 (that is, loading and unloading port for the substrate 30) visually by a user of HYPE device 1, in a state where the flange part 11b is detached from the reaction furnace 10 in the substrate loading step (S11). In order to facilitate this confirmation, it is preferable that the auxiliary vessel 40 is made of a material having a light transmittance (visibility) such as quartz glass, etc.

As a result thereof, when the auxiliary vessel 40 is empty or a reservoir amount in the auxiliary vessel 40 is in a state that is smaller than a predetermined amount (an amount required for the next replenishment processing (described later)) and can be regarded as empty, subsequently, as shown in FIG. 3, charging of the solidified matter of the metal raw material 20 into the auxiliary vessel 40 is performed (S22). Specifically, as shown in FIG. 4, a solidified matter 20a of the metal raw material 20 is charged into the auxiliary vessel 40 by the user of HYPE device 1 in a state that the lid member 43 of the auxiliary vessel 40 is detached.

The solidified matter 20a of the metal raw material 20 to be charged is, for example, a granular or rectangular parallelepiped ingot of Ga. In order to charge such a solidified matter 20a, the inlet port 42b in the reservoir vessel part 42 of the auxiliary vessel 40 has a size capable of charging the solidified matter 20a with no need for being melted. Specifically, the inlet port 42b may be any one of a rectangular shape, a round shape and the like, and its shape is not particularly limited, and is formed by the opening larger than the solidified matter 20a (for example, the opening of a size of φ2 cm or more, which is larger than a general ingot).

When the solidified matter 20a is charged into the auxiliary vessel 40, the outlet port 42a formed at the bottom part of the reservoir vessel part 42 constituting the auxiliary vessel 40 is in a state sealed by the sealing plug 44. Further, after the solidified matter 20a is charged into the auxiliary vessel 40, the inlet port 42b of the reservoir vessel part 42 of the auxiliary vessel 40 is closed by the lid member 43.

When the auxiliary vessel 40 is not empty or not in a state that can be regarded as empty, the preparation processing for the auxiliary vessel 40 is ended without charging the solidified matter of the metal raw material 20 into the auxiliary vessel 40.

After end of the preparation processing (S21, S22) for the auxiliary vessel 40 and completion of the substrate loading step (S11), the abovementioned temperature raising step (S12) is subsequently performed. When the temperature raising step (S12) is performed, the solidified matter 20a of the metal raw material 20 charged into the auxiliary vessel 40 is heated to a temperature (for example, 1000° C.) exceeding the melting point. Then, a temperature state after heating is maintained until start of the temperature decreasing step (S14). As a result thereof, in the auxiliary vessel 40, the metal raw material 20 is reserved in the auxiliary vessel 40 in a state where the metal raw material 20 is melted and liquefied and in a state where purification treatment is performed for removing impurities, etc., from the metal raw material 20. At this time, if the inlet port 42b is closed by the lid member 43, the metal raw material 20 is prevented from evaporating from the inside of the auxiliary vessel 40 and diffusing into the reaction furnace 10 even if the high temperature state of, for example, 1000° C. is maintained.

A reservoir state of the metal raw material 20 in the auxiliary vessel 40 is continued even in the film formation processing step (S13) performed subsequently. In the film formation processing step (S13), as described above, GaCl gas and NH$_3$ gas are supplied to the growth section 13 in the reaction furnace 10. At this time, by supplying the inert gas from the purge tube 50, generation of unnecessary reaction byproducts or the like due to arrival of GaCl gas or NH$_3$ gas to the surroundings of the auxiliary vessel 40 can be suppressed. Also, by supplying the inert gas from the purge tube 50, the atmosphere in the auxiliary vessel 40 can be substituted with the inert gas through the through hole 43b formed on the lid member 43, and therefore oxidation, etc., of the metal raw material 20 in the auxiliary vessel 40 can be suppressed.

(Procedure of Replenishment Processing of the Metal Raw Material into the Storage Vessel)

Incidentally, in HVPE device 1, when the film formation processing step (S13) is performed, an amount of the metal raw material 20 stored in the storage vessel 21 is decreased.

When the metal raw material 20 is decreased, a liquid level height of the metal raw material 20 falls in the storage vessel 21. When the liquid level height of the metal raw material 20 in the storage vessel 21 is changed, film formation conditions, etc., are changed under an influence of the change of the liquid level height in the film formation processing step (S13) performed after such a change, and as a result thereof, desired film formation processing cannot be performed.

Accordingly, when the film formation processing is repeatedly performed to the substrate 30 in HVPE device 1, not only to prevent the inside of the storage vessel 21 from being emptied due to the decrease of the metal raw material 20, but also to keep the liquid level height of the metal raw material 20 in the storage vessel 21 as constant as possible, replenishment of the metal raw material 20 into the storage vessel 21 should be performed at regular intervals.

In HVPE device 1 described in this embodiment, replenishment of the metal raw material 20 into the storage vessel 21 is performed by the following procedure.

Figure 5:
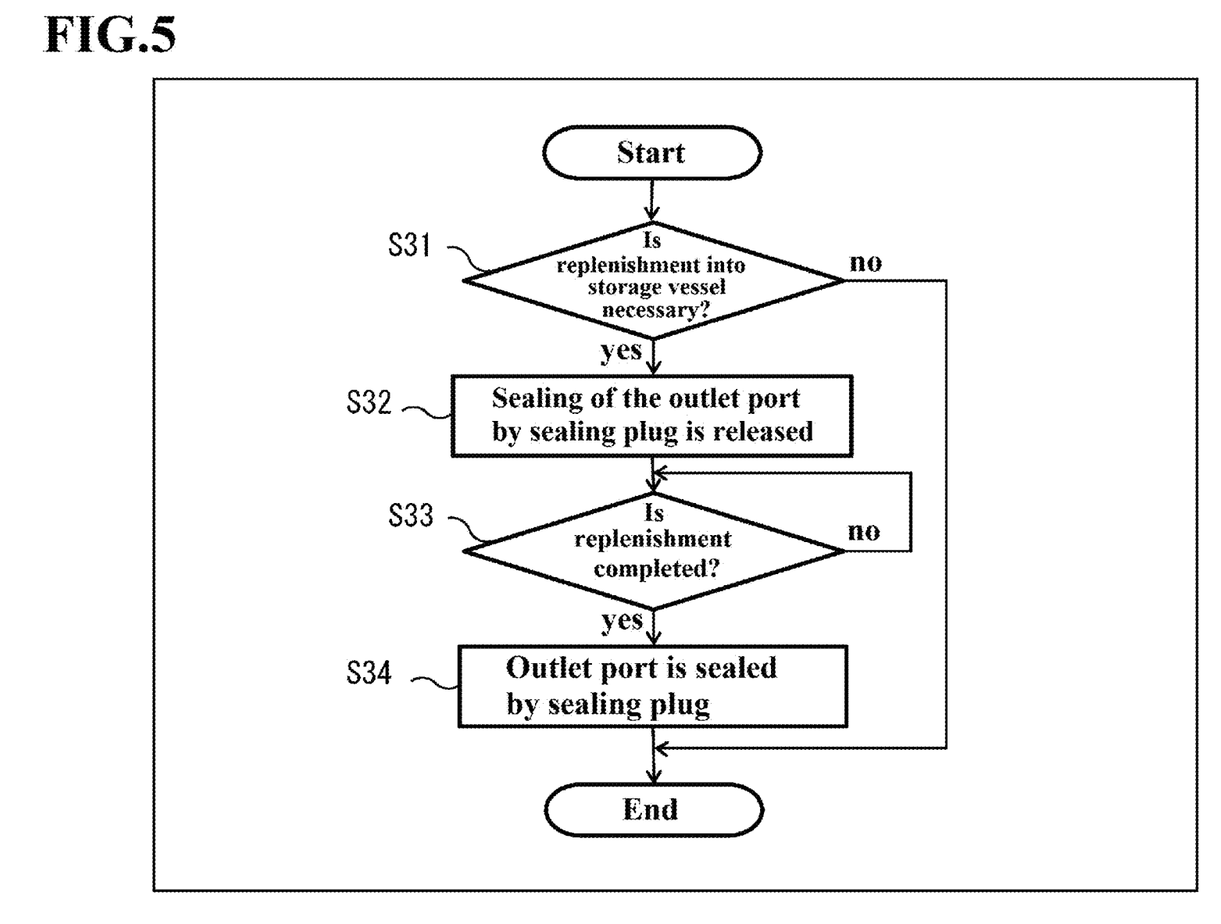
FIG. 5 is a flowchart showing an example of a procedure of replenishment processing of performing replenishment of a metal raw material into the storage vessel in HYPE device according to the present invention.
Figure 6:
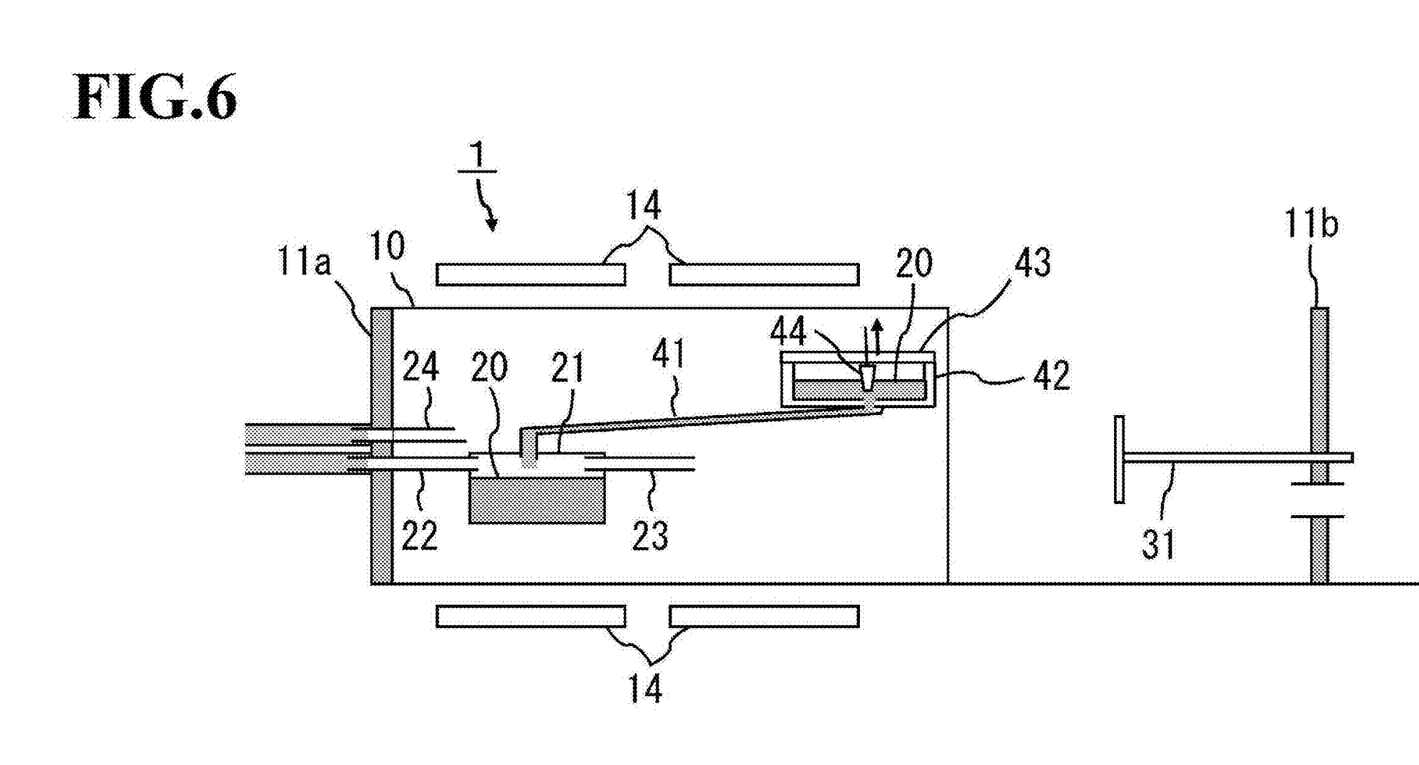
FIG. 6 is an explanatory view showing an example of a state of HYPE device when replenishment processing shown in FIG. 5 is performed.

FIG. 5 is a flowchart showing an example of the procedure of replenishment processing of performing replenishment of the metal raw material into the storage vessel in HVPE device according to the present invention. FIG. 6 is an explanatory view showing an example of a state of HYPE device when replenishment processing shown in FIG. 5 is performed.

In HYPE device 1, processing of replenishment of the metal raw material 20 into the storage vessel 21 is performed before completion of the substrate loading step (S11) performed for the next new substrate 30 after start of the substrate unloading step (S15). In HVPE device 1, as a prerequisite for performing replenishment of the metal raw material 20 into the storage vessel 21, the preparation processing for the auxiliary vessel 40 is already completed and the metal raw material 20 is reserved in the auxiliary vessel 40 in a melted and liquefied state.

Specifically, first, as shown in FIG. 5, whether or not replenishment of the metal raw material 20 into the storage vessel 21 is necessary is judged (S31). This judgment may be performed by the user of HYPE device 1 visually confirming how much metal raw material 20 is stored in the storage vessel 21. In order to easily perform such a confirmation, it is preferable that the storage vessel 21 and the reaction furnace 10 including the storage vessel 21 are made of a material having a light transmittance (visibility) such as quartz glass, etc.

As a result thereof, when it is judged that replenishment of the metal raw material 20 is not necessary, processing of performing replenishment of the metal raw material 20 into the storage vessel 21 is ended without performing replenishment of the metal raw material 20 into the storage vessel 21.

On the other hand, when it is judged that replenishment of the metal raw material 20 is necessary, subsequently, release of a sealing state of the outlet port 42a by the sealing plug 44 is performed to the auxiliary vessel 40 (S32). Specifically, as shown in FIG. 6, sealing of the outlet port 42a may be released in such a manner that the user of HYPE device 1 reaches the auxiliary vessel 40 disposed in the vicinity of the edge opening of the reaction furnace 10 (that is, the loading and unloading port for the substrate 30) and lifts the rod part 44b of the sealing plug 44 upward so that the outlet port 42a sealed by the plug part 44a of the sealing plug 44 is in an opened state, in a state where the flange part 11b is detached from the reaction furnace 10 in either the substrate unloading step (S15) or the substrate loading step (S11).

At this time, in the auxiliary vessel 40, the metal raw material 20 is melted and reserved in a liquefied state. Further, the auxiliary vessel 40 is disposed at an upper side of the storage vessel 21, and the outlet port 42a formed at the bottom part of the auxiliary vessel 40 is communicated with the inside of the storage vessel 21 through the connection pipe 41. Accordingly, when the sealing of the outlet port 42a by the sealing plug 44 is released and the outlet port 42a is in an opened state, the liquefied metal raw material 20 flows from the outlet port 42a of the auxiliary vessel 40 into the storage vessel 21 through the inside of the connection pipe 41 due to the gravity. At this time, at least one of the guide hole 43a or the through hole 43b provided on the lid member 43 functions as an air vent hole, so that the flow of the metal raw material 20 due to gravity is smoothly formed. In this manner, replenishment of the metal raw material 20 into the storage vessel 21 from the inside of the auxiliary vessel 40 is started.

After starting the replenishment of the metal raw material 20 into the storage vessel 21 from the inside of the auxiliary vessel 40, subsequently, as shown in FIG. 5, whether or not replenishment of the metal raw material 20 into the storage vessel 21 is completed is judged (S33). This judgment may be performed by the user of HVPE device 1 by visually confirming whether or not a storage amount of the metal raw material 20 in the storage vessel 21 reaches a predetermined reference amount set in advance. This confirmation can be easily performed as long as the reaction furnace 10 and the storage vessel 21 are made of a material having a light transmittance (visibility) such as quartz glass, etc.

As a result thereof, when the storage amount of the metal raw material 20 reaches the predetermined reference amount, and with this matter as a trigger, the outlet port 42a is sealed by the sealing plug 44, and replenishment of the metal raw material 20 from the auxiliary vessel 40 into the storage vessel 21 is ended (S34). Specifically, in a state where the flange part 11b is detached from the reaction furnace 10, the rod part 44b of the sealing plug 44 lifted by the user of HVPE device 1 is lowered downward and the outlet port 42a is sealed by the sealing part 44a of the sealing plug 44 and is set in a closed state, and replenishment of the metal raw material 20 is ended.

In HVPE device 1, replenishment of the metal raw material 20 into the storage vessel 21 is performed through procedure (S31 to S34) as described above. That is, replenishment of the metal raw material 20 into the storage vessel 21 is started or ended by communicating the storage vessel 21 and the auxiliary vessel 40 disposed at the upper side of the storage vessel 21 with each other through the connection pipe 41, and by opening and closing the outlet port 42a to which the connection pipe 41 is connected, using the sealing plug 44.

When replenishment of the metal raw material 20 into the storage vessel 21 from the auxiliary vessel 40 is performed by this procedure, inflow of air to the side of the storage vessel 21 from the side of the auxiliary vessel 40 can be prevented by allowing the metal raw material 20 to remain at the bottom part of the auxiliary vessel 40 instead of allowing all of the metal raw material 20 to flow, the metal raw material 20 being reserved in the auxiliary vessel 40 by one replenishment. Further, by allowing the metal raw material 20 to remain at the bottom part of the auxiliary vessel 40, an oxide film formed on the surface of the metal raw material 20 in the auxiliary vessel 40 can be prevented from flowing to the side of the storage vessel 21, which may occur when the flange part 11b is opened. In other words, by performing replenishment of the metal raw material 20 into the storage vessel 21 while allowing the metal material 20 to remain at the bottom part of the auxiliary vessel 40, inflow of the air or the oxide film, etc., can be prevented. Therefore, purity of the replenished metal raw material 20 is ensured in the storage vessel 21, and it is realized to perform high-purity crystal growth immediately after replenishment.

As described above, the auxiliary vessel 40 is preferably formed to have a large capacity as much as possible within a range that fits in the reactor 10 without inhibiting installation of the substrate 30 in the reaction furnace 10, in order to allow the metal raw material 20 to remain at the bottom part even when replenishment of a required amount of metal raw material 20 into the storage vessel 21 is performed. A heat capacity of the reserved metal raw material 20 can be sufficiently secured when the auxiliary vessel 40 is formed to have a large capacity. Therefore, a transition from a liquefied state to a solidified state is difficult even through the temperature decreasing step (S14), and this point is also preferable.

In addition, when the auxiliary vessel 40 is disposed in the vicinity of the edge opening of the reaction furnace 10 (that is, loading and unloading port for the substrate 30), it is easy to perform charging of the solidified matter 20a into the auxiliary vessel 40 and sealing or unsealing, etc., of the outlet port 42a by the sealing plug 44. That is, in order to make handling of HVPE device 1 easy for a user, the position of the auxiliary vessel 40 in the reaction furnace 10 is preferably a position in the vicinity of the loading and unloading port for the substrate 30 or a position easily accessible for the user during loading and unloading of the substrate. Further, the position of the auxiliary vessel 40 in the reaction furnace 10 is a position at which the solidified matter 20a in the auxiliary vessel 40 can be melted, and a position at the upper side of the storage vessel 21 so that the metal raw material 20 in a molten state flows into the storage vessel 21 utilizing the gravity.

In such an auxiliary vessel 40, the outlet port 42a opened and closed by the sealing plug 44 is formed at the bottom part thereof. When the outlet port 42a is formed at the bottom part of the auxiliary vessel 40, the outlet port 42a and the sealing plug 44 are liquid-sealed by the metal raw material 20 reserved in the auxiliary vessel 40, in a state where the outlet port 42a is sealed by the sealing plug 44. In other words, when the outlet port 42a is in the closed state, the outlet port 42a is liquid-sealed by the metal raw material 20, and therefore airtightness in the storage vessel 21 can be secured, the storage vessel 21 being communicated with the auxiliary vessel 40 through the connection pipe 41. Therefore, even when the storage vessel 21 and the auxiliary vessel 40 are configured to communicate with each other, a gas leakage of the metal chloride gas, etc., is not allowed to generate in the storage vessel 21.

Further, when the outlet port 42a is formed at the bottom part of the auxiliary vessel 40, opening and closing of the outlet port 42a for starting or ending replenishment of the metal raw material 20 is performed not on the side of the storage vessel 21 but on the side of the auxiliary vessel 40. Therefore, in a state where the outlet port 42a is closed due to the sealing by the sealing plug 44, the metal raw material 20 is not remained in the pipe of the connection pipe 41 through which the storage vessel 21 and the auxiliary vessel 40 are communicated with each other. When the metal raw material 20 remains in the pipe of the connection pipe 41, and in a case that the metal raw material 20 in the connection pipe 41 is solidified after passing through the temperature decreasing step (S14) for example, there is a possibility that the connection pipe 41 is damaged due to a volume variation of the metal raw material 20 caused by the solidification. However, such a possibility of damaging the connection pipe 41 can be eliminated, when the outlet port 42a is formed at the bottom part of the auxiliary vessel 40 and the metal raw material 20 is not allowed to remain in the connection pipe 41.

Opening and closing of the outlet port 42a in the auxiliary vessel 40 is performed by lifting the sealing plug 44 upward or lowering it downward. At this time, when the guide hole 43a is provided on the lid member 43 of the auxiliary vessel 40, the rod part 44b of the sealing plug 44 is inserted into the guide hole 43a, whereby a vertical movement of the sealing plug 44 is guided. That is, since the vertical movement of the sealing plug 44 is guided by the guide hole 43a of the lid member 43, occurrence of collapse or the like of the sealing plug 44 at the time of the vertical movement is suppressed, and an opening and closing operation of the outlet port 42a by the sealing plug 44 can be smoothly and easily performed.

(3) Effect of this Embodiment

According to this embodiment, one or a plurality of effects described below can be exhibited.
(a) In this embodiment, the auxiliary vessel 40 that reserves the metal raw material 20 is disposed at the upper side of the storage vessel 21, and even when there is a requirement for performing replenishment of the metal raw material 20 into the storage vessel 21, replenishment of the metal raw material 20 into the storage vessel 21 is performed from the auxiliary vessel 40 through the connection pipe 41 through which the auxiliary vessel 40 and the storage vessel 21 are communicated with each other only by setting the outlet port 42a in the opened state, which has been sealed by the sealing plug 44. In addition, the auxiliary vessel 40 that reserves the metal raw material 20 has an opening that is large enough to charge the solidified matter 20a of the metal raw material 20, as the inlet port 42b for the metal raw material 20. Therefore, even in a case that the metal raw material 20 is the solidified matter 20a, as well as a case that the metal raw material 20 is in a liquid state, the solidified matter 20a can be charged as it is. Further, even when the solidified matter 20a is charged as it is, the charged solidified matter 20a can be reserved in a liquefied state because the auxiliary vessel 40 is disposed at a position heated by the heater units 14 to a temperature exceeding the melting point of the metal raw material 20.

Therefore, according to this embodiment, there is no need to perform a disassembling operation for detaching the pipe 22 which is connected to the storage vessel 21, from the storage vessel 21 and a reassembling operation for connecting the detached pipe 22 to the storage vessel 21 when replenishment of the metal raw material 20 into the storage vessel 21 is performed. Further, since the solidified matter 20a of the metal raw material 20 can be charged into the auxiliary vessel 40 as it is, there is no need to separately prepare a heating device such as an electric furnace, etc. Further, by utilizing heating by the heater units 14, not only melting and liquefying the solidified matter 20a in the auxiliary vessel 40, but also a purification treatment (for example, a high-temperature heat treatment for a long time) for removing impurities, etc., from the liquefied metal raw material 20 can be performed, and processing of confirming the growth reproducibility of the metal raw material 20 for replenishment is not required.

In other words, according to this embodiment, even when the replenishment of the metal raw material 20 into the storage vessel 21 is performed, much labor and time, etc., are not required unlike a conventional case in which a pipe disassembling operation or a pipe reassembling operation, etc., is required, and further another device such as a heating device, etc., is not required to prepare. Therefore, it is easy to perform replenishment of the metal raw material 20 into the storage vessel 21 disposed in the reaction furnace 10, and the labor and time, etc., required for this replenishment can be remarkably reduced compared to a conventional case.

(b) According to this embodiment, as described above, the labor and time, etc., required for the replenishment of the metal raw material 20 into the storage vessel 21 can be remarkably reduced. Therefore, it is easy to increase a replenishment frequency for the metal raw material 20 into the storage vessel 21 as compared with a conventional case. When the replenishment frequency for the metal raw source 20 is increased, the liquid level height of the metal raw material 20 in the storage vessel 21 can be kept as constant as possible, and an influence of a change of the liquid level height on film formation conditions, etc., (in other words, possibility that the film formation processing cannot be performed as desired) can be avoided.

(c) According to this embodiment, replenishment of the metal raw material 20 into the storage vessel 21 from the auxiliary vessel 40 is performed by utilizing the gravity acting on the metal raw material 20 while using the connection pipe 41 through which the auxiliary vessel 40 and the storage vessel 21 are communicated with each other. Further, opening and closing of the outlet port 42a for starting or ending the replenishment of the metal raw material 20 is performed by utilizing the vertical movement of the sealing plug 44 for sealing the outlet port 42a. In other words, a configuration required for performing replenishment of the metal raw material 20 is very simple such as the auxiliary vessel 40, the connection pipe 41, and the sealing plug 44, etc., and does not require a complicated configuration such as a valve or a driving source, etc. In addition, the auxiliary vessel 40, the connection pipe 41, and the sealing plug 44, etc., are all made of a heat-resistant material such as quartz glass, etc. Accordingly, even when the inside of the reaction furnace 10 is heated to a high temperature of about 850° C. to 1000° C., it is possible to dispose the auxiliary vessel 40, the connection pipe 41, the sealing plug 44, etc., which are configurations required for performing replenishment of the metal raw material 20.

(d) According to this embodiment, the outlet port 42a of the metal raw material 20 is formed at the bottom part of the auxiliary vessel 40, and therefore when the outlet port 42a is in the closed state, the outlet port 42a is liquid-sealed by the metal raw material 20 in the auxiliary vessel 40. Therefore, even when the storage vessel 21 and the auxiliary vessel 40 are configured to communicate with each other, the airtightness of the inside of the storage vessel 21 is secured when the outlet port 42a is in the closed state, thus not allowing a gas leakage of the metal chloride gas or the like to generate in the storage vessel 21. Further, the outlet port 42a of the metal raw material 20 is formed at the bottom part of the auxiliary vessel 40, and therefore opening and closing of the outlet port 42a is performed on the side of the auxiliary vessel 40, thus not allowing the metal raw material 20 to remain in the connection pipe 41 in the closed state of the outlet port 42a by the sealing of the sealing plug 44. Therefore, even when there is a temperature change like causing solidification of the metal raw material 20, the connection pipe 41 is not damaged due to the volume variation of the metal raw material 20, which is caused by the temperature change.

(e) According to this embodiment, the auxiliary vessel 40 is disposed at a position in the vicinity of the edge opening of the reaction furnace 10 (that is, the loading and unloading port for the substrate 30) or a position easily accessible for a user during loading and unloading of the substrate. Therefore, it is easy to charge the solidified matter 20a into the auxiliary vessel 40 and seal or unseal the outlet port 42a by the sealing plug 44 and so on, so as to make handling of the auxiliary device easy for the user of the HVPE device.

(f) According to this embodiment, the inlet port 42b of the auxiliary vessel 40 is closed by the lid member 43. Therefore, even when a high temperature state is maintained in the reaction furnace 10, the metal raw material 20 is prevented from evaporating and diffusing into the reaction furnace 10 from the auxiliary vessel 40. In other words, unnecessary reactions caused by the evaporation of the metal raw material 20 can be prevented from occurring in the reaction furnace 10, and as a result thereof, high quality film formation processing in the growth section 13 in the reaction furnace 10 can be ensured.

(g) According to this embodiment, the guide hole 43a for guiding the opening and closing operation of the outlet port 42a by the sealing plug 44 is formed on the lid member 43 that closes the inlet port 42b of the auxiliary vessel 40. Therefore, occurrence of collapse or the like of the sealing plug 44 at the time of the vertical movement is suppressed, and the opening and closing operation of the outlet port 42a by the sealing plug 44 can be smoothly and easily performed.

(h) According to this embodiment, a purge processing unit including the purge tube 50 supplies the inert gas to the surroundings of the auxiliary vessel 40 in the reaction furnace 10 through the purge tube 50. Therefore, GaCl gas or $NH_3$ gas is prevented from reaching the surroundings of the auxiliary vessel 40 even through the film formation processing step (S13), and as a result, it is possible to suppress the generation of unnecessary reaction byproducts in the surroundings of the auxiliary vessel 40.

(i) According to this embodiment, the through hole 43b through which the inert gas passes, is formed on the lid member 43 that closes the inlet port 42b of the auxiliary vessel 40. Therefore, when the inert gas is supplied from the purge tube 50 to the surroundings of the auxiliary vessel 40, the inert gas passes through the through hole 43b and intrudes into the auxiliary vessel 40, whereby the atmosphere in the auxiliary vessel 40 can be substituted with the inert gas. That is, the atmosphere in the auxiliary vessel 40 can be replaced with the inert gas through the through hole 43b formed on the lid member 43, and therefore, oxidation, etc., of the metal raw material 20 in the auxiliary vessel 40 can be suppressed.

(4) Modified Example, Etc.

Preferable embodiments of the present invention have been described above. However, the abovementioned disclosure contents show one of the exemplary embodiments of the present invention. That is, a technical range of the present invention is not limited to the abovementioned exemplary embodiments.

For example, in this embodiment, the following case is mentioned as an example: the metal raw material 20 stored in the storage vessel 21 is Ga, and HCl gas is supplied into the storage vessel 21 as a chlorine-based gas, and GaCl gas which is a metal chloride gas generated due to a reaction of Ga and HCl gas is supplied to the growth section 13. However, the present invention is not limited thereto, and another metal raw material can also be used as the metal raw material 20. It is conceivable to use another metal raw material such as indium (In), mercury (Hg), or the like, as the metal raw material 20.

Further, for example, in this embodiment, HVPE device 1 for forming a thin film on a substrate to be processed by utilizing a crystal growth by HYPE method, is exemplified as a semiconductor manufacturing device. However, the present invention is not limited thereto, and can be applied to a semiconductor manufacturing device by other growth method.

Further, for example, in this embodiment, the procedure of the manufacturing method for constituting the semiconductor light emitting element which is a kind of the semiconductor device, has been described. However, the present invention is not limited thereto, and can be applied to a method for manufacturing a semiconductor device of other type, as long as this is constituted through the film formation processing performed by supplying a source gas.

DESCRIPTION OF SIGNS AND NUMERALS

1 HYPE device
10 Reaction furnace
14 Heater unit
20 Metal raw material
20a Solidified matter
21 Storage vessel
30 Substrate
40 Auxiliary vessel
41 Connection pipe
42 Reservoir vessel part
42a Outlet port
42b Inlet port
43 Lid member
43a Guide hole
43b Through hole
50 Purge tube

The invention claimed is:

1. A semiconductor manufacturing device that supplies a source gas to a substrate installed in a reaction furnace and performs film formation processing to the substrate, comprising:
 a storage vessel which is disposed in the reaction furnace and which stores a metal raw material as a base of the source gas;
 an auxiliary vessel which is disposed at an upper side of the storage vessel in the reaction furnace and which is a bottomed vessel having an inlet port for the metal raw material;
 a connection pipe through which an outlet port for the metal raw material formed on the auxiliary vessel and an inside of the storage vessel are communicated with each other;
 a sealing plug for sealing the outlet port so as to be opened and closed freely; and
 heater units that heat an inside of the reaction furnace to a predetermined temperature so as to melt the metal raw material in the auxiliary vessel and the metal raw material in the storage vessel, and to a predetermined temperature required for film formation processing performed to the substrate.

2. The semiconductor manufacturing device according to claim 1, wherein the outlet port is formed at a bottom part of the auxiliary vessel.

3. The semiconductor manufacturing device according to claim 1, wherein the reaction furnace has a loading and unloading port for the substrate so as to be opened and closed freely, and
 the auxiliary vessel is disposed at a position in the vicinity of the loading and unloading port or at a position accessible during loading and unloading of a substrate.

4. The semiconductor manufacturing device according to claim 1, wherein the auxiliary vessel has a lid member that closes the inlet port.

5. The semiconductor manufacturing device according to claim 4, wherein the lid member has a guide hole that guides an opening and closing operation of the outlet port by the sealing plug.

6. The semiconductor manufacturing device according to claim 4, comprising a purge processing unit that supplies an inert gas to surroundings of the auxiliary vessel in the reaction furnace.

7. The semiconductor manufacturing device according to claim 6, wherein the lid member has a through hole through which the inert gas passes.

8. A semiconductor manufacturing method, comprising:
 installing a substrate at a predetermined position in a reaction furnace including a storage vessel that stores a metal raw material; and
 charging the metal raw material from an inlet port into an auxiliary vessel disposed at an upper side of the storage vessel in the reaction furnace and formed as a bottomed vessel having an outlet port for the metal raw material communicating with an inside of the storage vessel through a connection pipe, and the inlet port for the metal raw material, in a state where the outlet port for the metal raw material is sealed by a sealing plug for sealing the outlet port so as to be opened and closed freely;
 heating the inside of the reaction furnace to a predetermined temperature so as to melt the metal raw material in the auxiliary vessel and the metal raw material in the storage vessel, and to a predetermined temperature required for film formation processing performed to the substrate;

supplying a gas into the storage vessel and causing a reaction between the gas and the metal raw material to generate a source gas, and discharging the source gas from the storage vessel and supplying the source gas to the substrate, so that film formation processing is performed;

unloading the substrate after performing the film formation processing, from the inside of the reaction furnace; and setting the sealing plug for sealing the outlet port in an opened state and performing replenishment of the metal raw material in the auxiliary vessel into the storage vessel through the outlet port and the connection pipe.

9. The semiconductor manufacturing method according to claim 8, wherein the metal raw material charged from the inlet port of the auxiliary vessel is a solidified matter.

* * * * *